us006954070B2

(12) United States Patent
Abele

(10) Patent No.: US 6,954,070 B2
(45) Date of Patent: Oct. 11, 2005

(54) NMR IMAGING SYSTEM WITH CONICAL PERMANENT MAGNET

(75) Inventor: Manlio Abele, New York, NY (US)

(73) Assignee: BRK Wireless Company, Inc., Park Ridge, IL (US)

( * ) Notice: Subject to any disclaimer, the term of this patent is extended or adjusted under 35 U.S.C. 154(b) by 86 days.

(21) Appl. No.: 10/694,419

(22) Filed: Oct. 27, 2003

(65) Prior Publication Data

US 2004/0140807 A1 Jul. 22, 2004

Related U.S. Application Data

(63) Continuation-in-part of application No. 10/336,333, filed on Jan. 6, 2003, now abandoned, application No. 10/393,999, filed on Mar. 24, 2003, now Pat. No. 6,707,363, and application No. 10/679,596, filed on Oct. 6, 2003.

(51) Int. Cl.[7] ................................................. G01V 3/00
(52) U.S. Cl. ....................................................... 324/319
(58) Field of Search ................................. 324/307, 309, 324/318, 319, 320; 335/296, 302, 301, 306, 304, 299

(56) References Cited

U.S. PATENT DOCUMENTS

| 5,034,715 | A | * | 7/1991 | Leupold et al. | .............. 335/306 |
| 5,798,680 | A | * | 8/1998 | Abele et al. | ................. 335/301 |
| 6,392,518 | B1 | * | 5/2002 | Abele | .......................... 335/299 |
| 6,600,401 | B2 | * | 7/2003 | Zuk et al. | ..................... 335/299 |
| 6,618,606 | B2 | * | 9/2003 | Overweg et al. | ........... 600/410 |
| 6,717,408 | B2 | * | 4/2004 | Minas et al. | ................. 324/318 |
| 2003/0164704 | A1 | * | 9/2003 | Yoshida | ....................... 324/322 |

* cited by examiner

*Primary Examiner*—Brij Shrivastav
*Assistant Examiner*—Dixomara Vargas

(57) ABSTRACT

An open magnetic structure comprising a conical magnetic structure including a hollow conical magnet surrounding and contacting an inner pole piece that generates an NMR imaging field around the head of a patient. The annular surface of contact between the conical magnetic structure and the inner pole piece is configured such that that annular surface of contact is maintained as an equipotential surface to maintain a uniform imaging field. An advantage is to integrate as one-piece the various permanent magnetic sections to greatly simplify fabrication. A method for determining the profile of the annular surface of contact is also included.

14 Claims, 7 Drawing Sheets

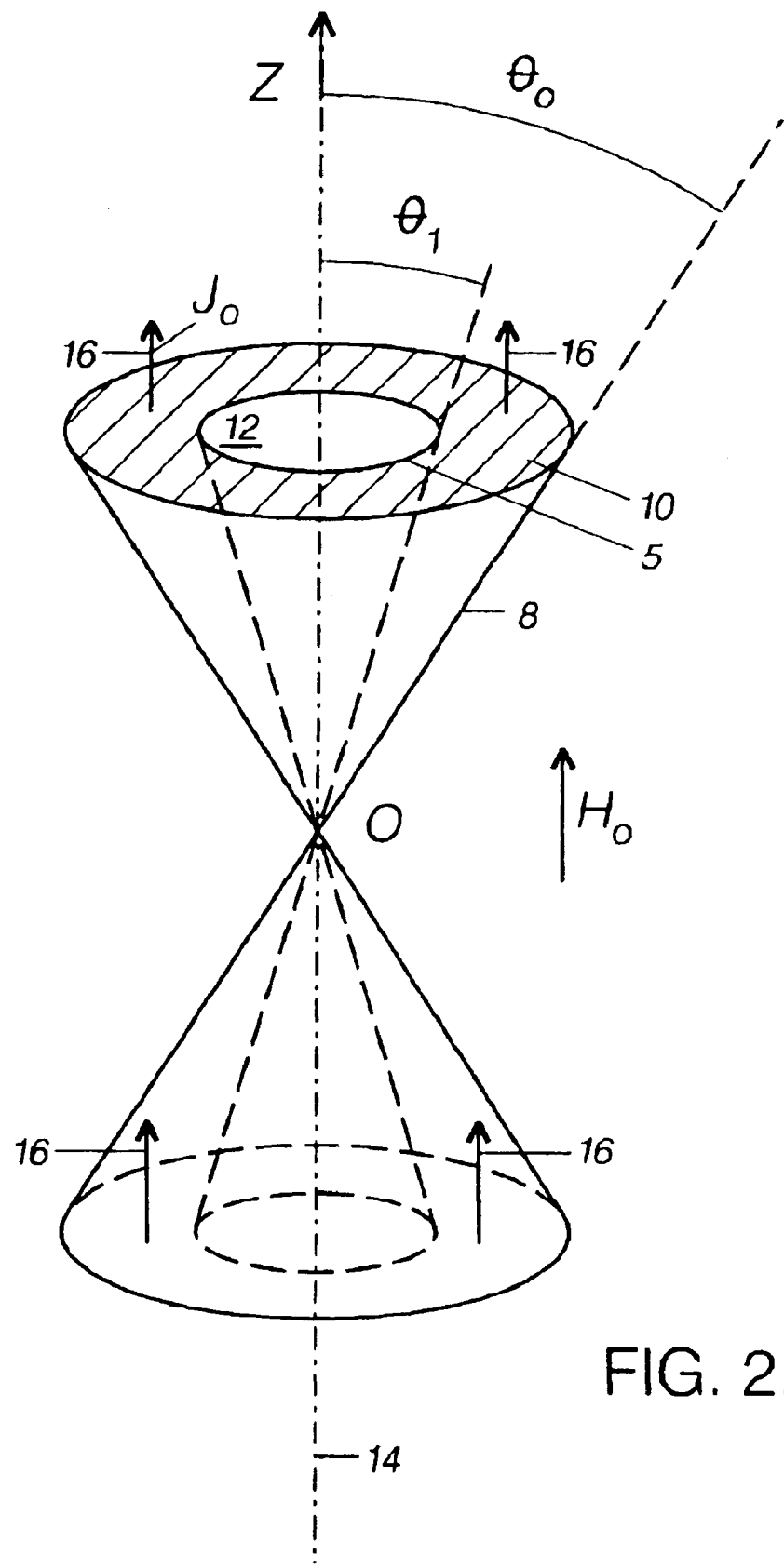
FIG. 2.1

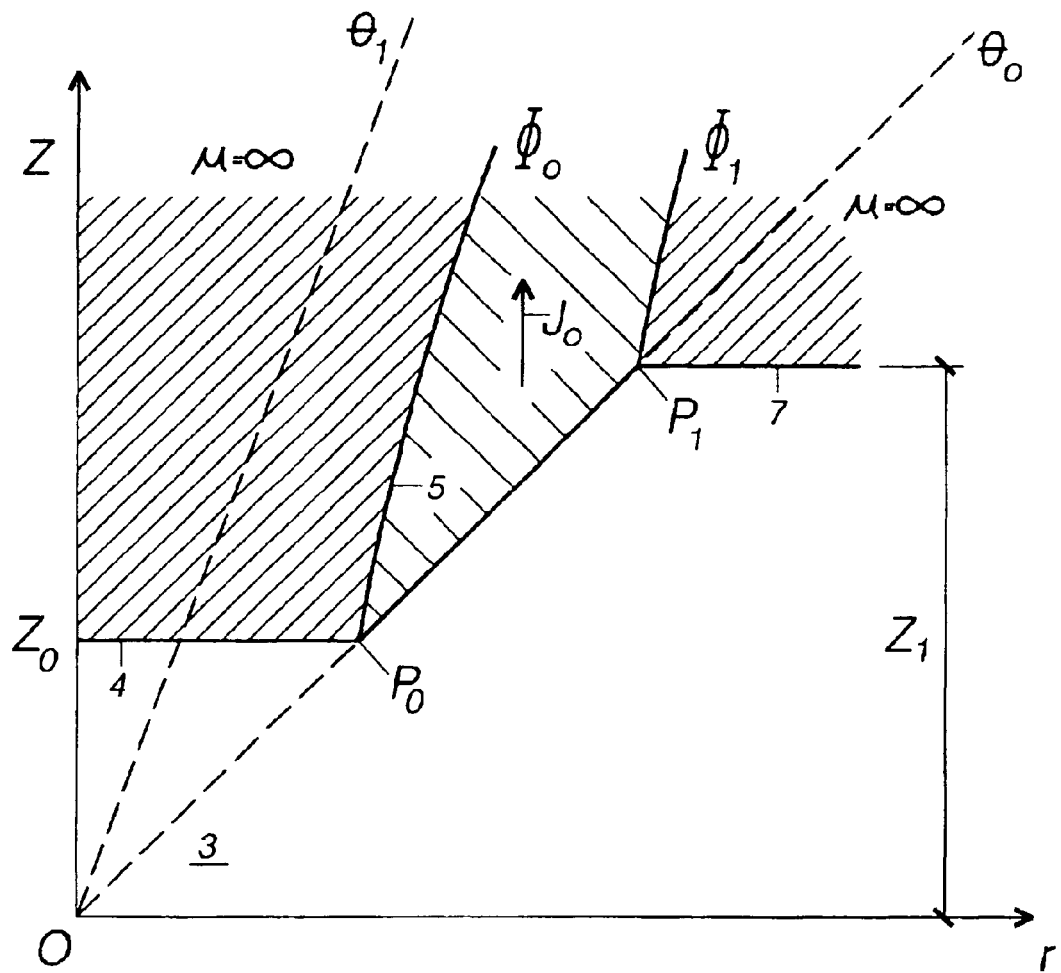
FIG. 2.2

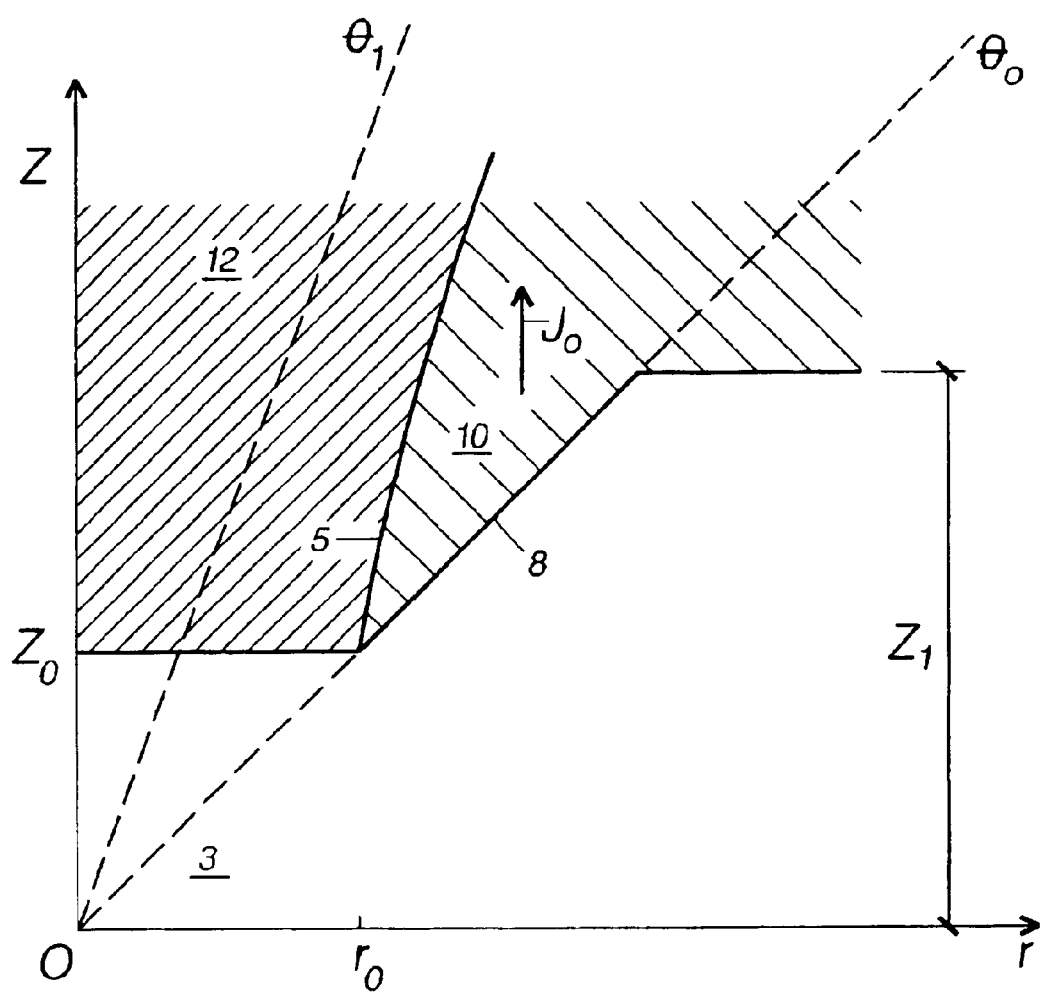
FIG. 2.3

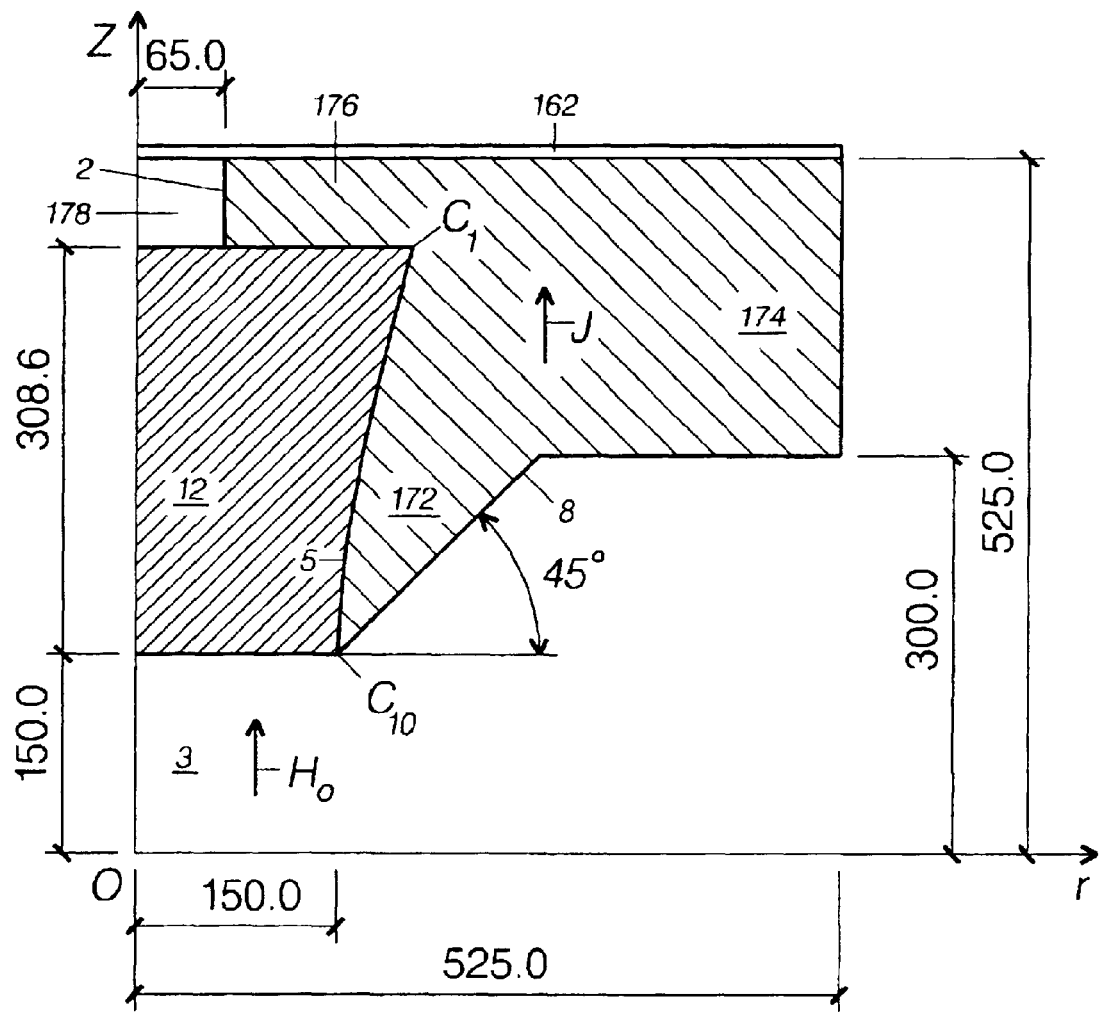
FIG. 2.4

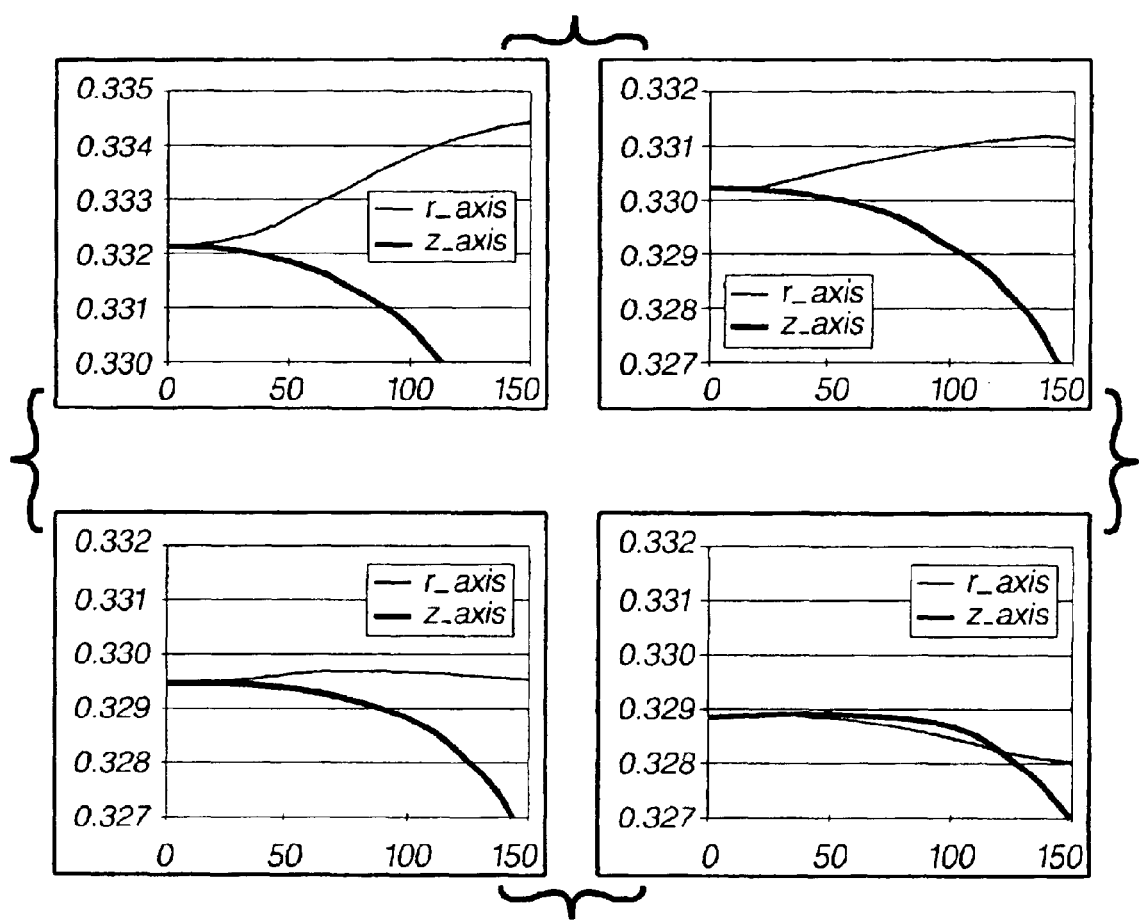
FIG. 2.5

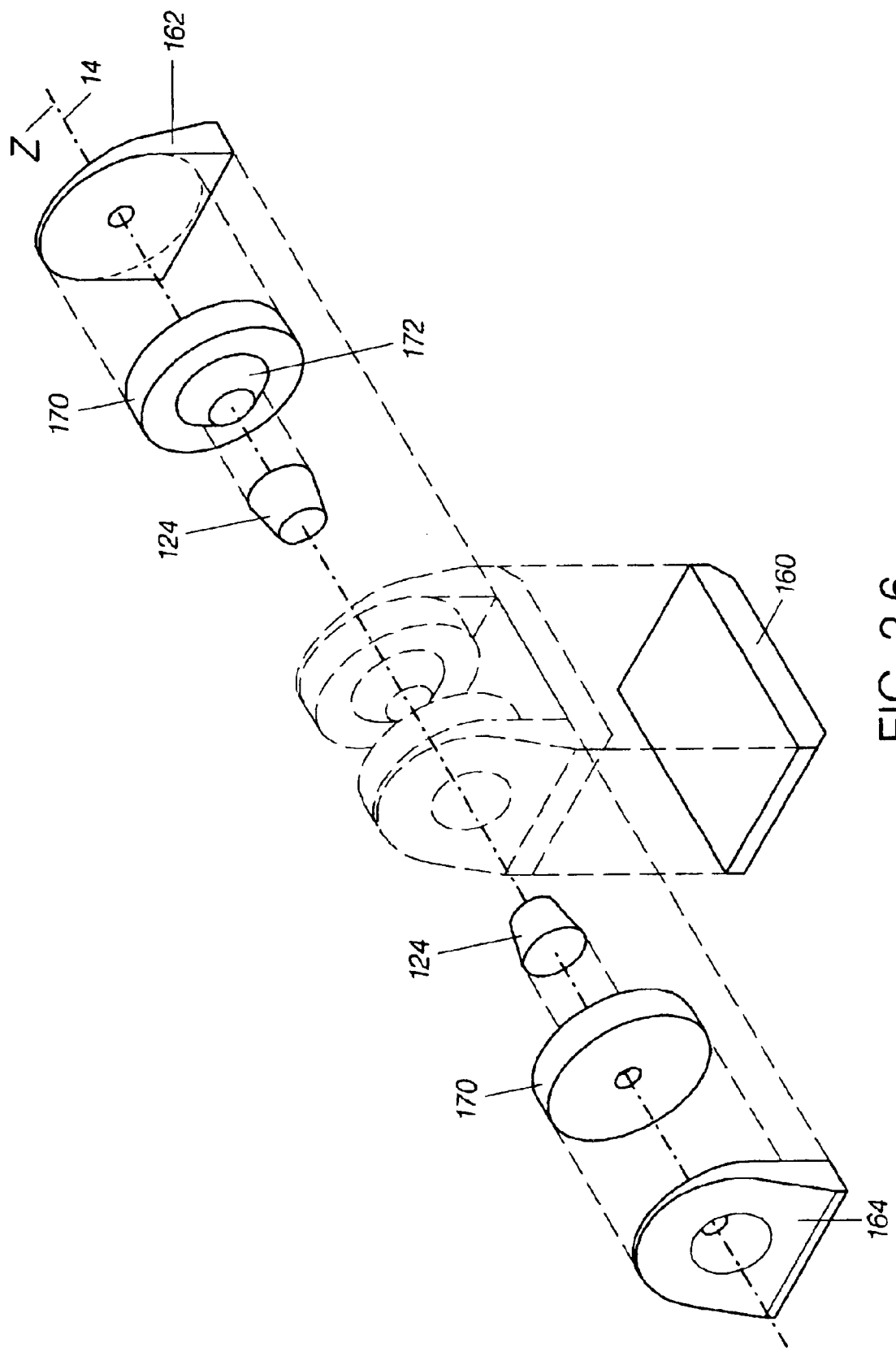
FIG. 2.6

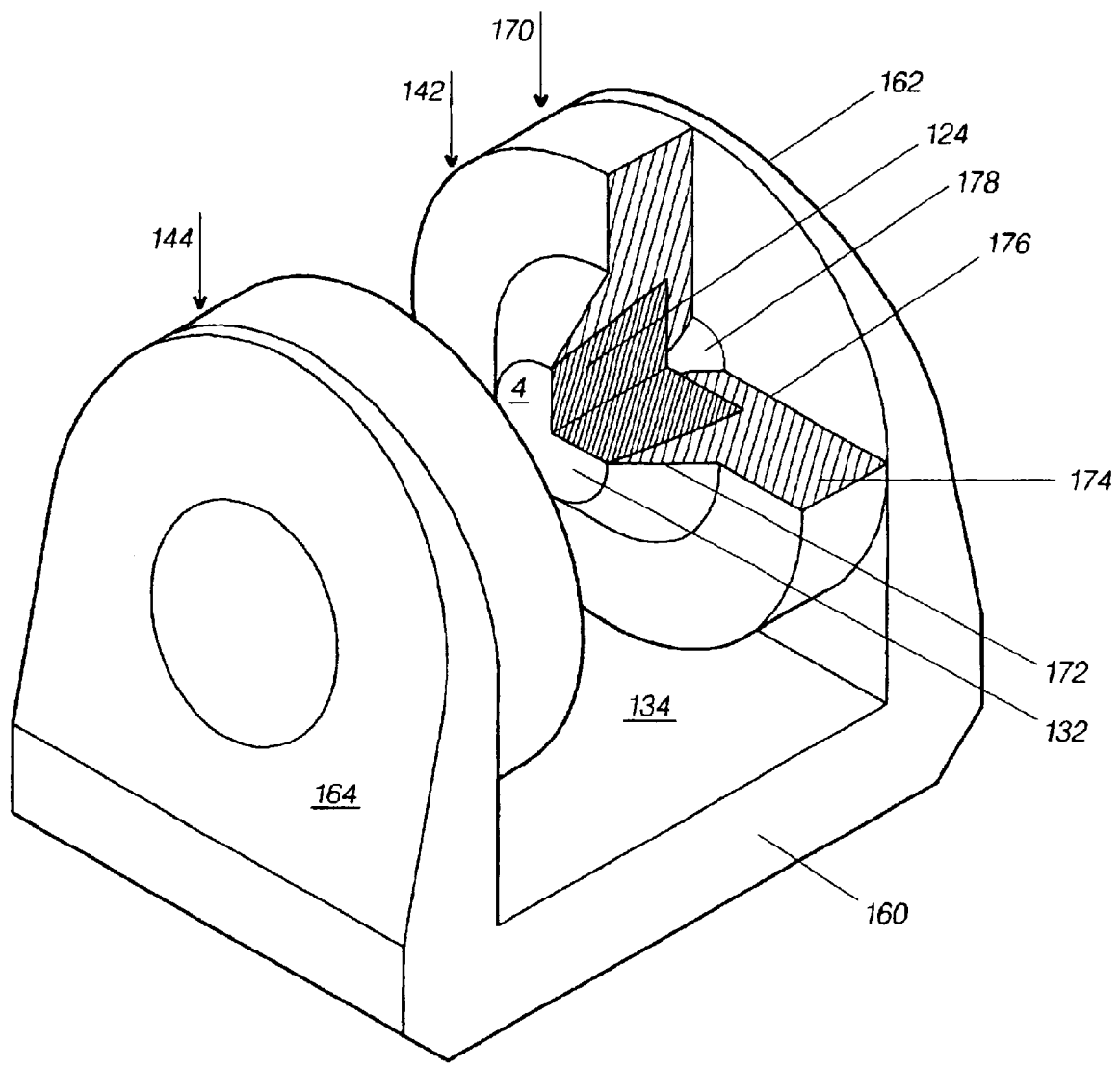
FIG. 2.7

NMR IMAGING SYSTEM WITH CONICAL PERMANENT MAGNET

RELATED APPLICATIONS

This application is a continuation-in-part by the same inventor of a first commonly-owned application, Ser. No. 10/336,333, filed Jan. 6, 2003 now abandoned.

This application is a continuation-in-part by the same inventor of a second commonly-owned application, Ser. No. 10/393,999, filed Mar. 24, 2003 now U.S. Pat. No. 6,707,363.

This application is a continuation-in-part by the same inventor of a third commonly-owned application, Ser. No. 10/679,596, filed Oct. 6, 2003.

The invention is directed to an NMR head imaging system using permanent magnets to establish the uniform imaging field.

BACKGROUND OF INVENTION

The first related application, whose full contents are herein incorporated by reference, describes a magnetic structure designed for NMR head imaging in interventional procedures. The requirements to be satisfied are described in detail in the related application. These requirements are satisfied by a permanent magnetic structure capable of generating a uniform field for NMR imaging over a region of interest encompassing the head of a patient and that is open at one side allowing access to the head of the patient by a physician for surgical or other medical purposes. In a preferred embodiment described in that application, the magnetic structure of the invention comprises a head structure generating a uniform magnetic field in a region of interest encompassing the patient's head, coaxially aligned with a shoulder structure generating a magnetic field that extends the uniform field to a second larger region encompassing the patient's shoulder, and joined to the head structure by a coaxially aligned transition structure which maintains the uniform magnetic field in the region connecting the first and second regions. A feature of that invention is a magnetic structure comprising a single pole piece that extends throughout the structure, which pole piece is connected to the head, shoulder, and transition magnetic structures, with the single pole piece in the shoulder region being configured to house a second magnet that cooperates in extending the uniform field to the shoulder region.

The second related application, whose full contents are herein incorporated by reference, describes a magnetic structure designed for NMR head imaging in interventional procedures which differs from the first application in that the permanent magnetic system is based on the use of a conical magnet or section of a conical magnet. In a preferred embodiment, the conical section is connected to an inner essentially cylindrical section, and the region inside the conical magnet comprises a high-permability ferromagnetic material. In a further preferred embodiment, the magnetic structure comprises opposed, spaced circular-symmetric structures with the region of interest falling within a cavity between the circular-symmetric structures and a second larger outer cylindrical magnet extends over each of the circular-symmetric structures. The three main permanent magnetic components of the structure of the preferred embodiment are all magnetized in the same direction, preferably parallel to the axis of the conical segment.

The second and third referenced applications describe configurations of the sections bordering the outer curved surface of the inner pole piece in order to ensure that that outer curved surface is an equipotential surface, a condition necessary to optimize the field uniformity in the region of interest. In the second referenced application, it was believed necessary to provide a triangular non-magnetic region adjacent that outer curved surface, and in the third referenced application it was believed necessary to provide magnetic straps in certain desired positions to achieve the desired equipotential condition. Both of those solutions were less than optimal because of the structural complexities of the permanent magnetic members plus the possible reduction in field intensity in the critical region of interest.

SUMMARY OF INVENTION

An object of the present invention is an improved NMR head imaging system based on the conical magnetic system that provides improved field uniformity in the region of interest and offers the possibility of a higher field intensity of the NMR imaging field or a structure of reduced weight, size, and complexity.

This and other objects of the invention are achieved in accordance with one aspect of the invention by the surprising discovery that it is possible to configure the inner curved surface of the permanent magnetic section such that an equipotential surface is present at that surface. The important consequence of this discovery is that the adjacent outer surface of the pole piece can be placed in direct contact with that inner curved surface without disturbing the necessary magnetic conditions to ensure the kind of uniform magnetic field needed in the region of interest for MRI imaging. Moreover, it also means that that permanent magnetic section can be constructed as a single integral body which greatly simplifies fabrication of the overall magnetic system.

In accordance with a further aspect of the invention, the outer permanent magnetic section that overlays the pole piece and the inner permanent magnetic section, which can now be integral with the latter, is provided with an axially aligned non-magnetic section at its center and positioned to maintain the desired field uniformity.

As in the second and third related applications, the three main permanent magnetic components of the integral structure of the preferred embodiment are all magnetized in the same direction, preferably parallel to the axis of the conical section.

The various features of novelty which characterize the invention are pointed out with particularity in the claims annexed to and forming a part of this disclosure. For a better understanding of the invention, its operating advantages and specific objects attained by its use, reference should be had to the accompanying drawings and descriptive matter in which there are illustrated and described preferred embodiments of the present invention, like reference numerals or letters signifying the same or similar components.

SUMMARY OF THE DRAWINGS

In the drawings:

FIG. 2.1 is a schematic perspective view of a conical magnetic structure to explain several of the principles on which the invention is based;

FIG. 2.2 illustrates the generation of a gap between pole pieces that will ultimately include the region of interest;

FIG. 2.3 is a simplified version of FIG. 2.2;

FIG. 2.4 is a cross-sectional view of part of one form of magnetic structure in accordance with the present invention. In this figure, as in the earlier incorporated applications, only one quarter of the actual structure is shown, as the remaining three quarters are essentially mirror images. In particular, a mirror image of that quarter is present on the opposite side of the vertical axis which if present would illustrate the top half of the full structure, and, similarly, a mirror image of that top half is present on the opposite side of the horizontal axis which if present would illustrate both the top and bottom halves and thus the full structure in accordance with the invention. One embodiment of the full structure according to the invention is illustrated in FIGS. 2.6 and 2.7. It will be apparent from the figures which ones represent only part of the full structure;

FIG. 2.5 shows four r-axis and z-axis field plots for increasing number of segments indicated by N that approximate the equipotential surface represented in FIG. 2.4 by line C1–C10;

FIG. 2.6 is an exploded view of the magnetic structure resulting from the expansion of FIG. 2.4 in the four quadrants;

FIG. 2.7 is a perspective view of the FIG. 2.6 embodiment with one-quarter cut away to show the interior in part.

DETAILED DESCRIPTION OF PREFERRED EMBODIMENTS

For a better understanding of the present invention, the reader is urged to read the many technical papers which I alone or with others published and which describe various configurations of NMR imaging systems as well as various schemes for compensating for magnetic field disturbances in composite structures that have been characterized as yoked, yokeless, or hybrid magnets. Particular attention is directed to issued U.S. Pat. Nos. 5,495,222; 5,790,006, and 6,265,959 which describe some of the problems of fabricating open magnetic structures with NMR imaging uniform fields and some solutions to those problems, the contents of which patents and publications are herein incorporated by reference.

It will also help to present some definitions of terms used herein to avoid ambiguity. These definitions include the following.

A "high permeability" member, as used herein, shall mean a soft ferromagnetic body having a permeability, $\mu$, exceeding 10 and preferably as high as possible. For simplicity, it is sometimes referred to in the literature as a ($\mu=\infty$) material, i.e., an ideal soft ferromagnetic body. For virtually all practical purposes, the performance of infinite permeability, unsaturated ferromagnetic material is the equivalent of soft iron.

A "yoked magnetic system", as used herein, is a permanent magnetic structure surrounded by a body of high permeability material serving as a yoke to carry the return flux of the induction B from one pole of the magnetic structure to the other pole. To avoid saturation, the yoke should have a large enough cross sectional area to convey the flux without saturating. The cross section typically varies to satisfy local flux-carrying requirements.

A "hybrid magnetic system", as used herein, is a permanent magnetic structure only partially surrounded by a body of high permeability material, both the high permeability material where present and the non-surrounded parts of the structure serving to carry the return flux of the induction B from one pole of the magnetic structure to the other pole. To avoid saturation, the body of high permeability material which can also be called a yoke should have a large enough cross sectional area to convey the flux without saturating. The yoke cross section typically varies to satisfy local flux-carrying requirements.

A "uniform magnetic field", as used herein, shall mean a magnetic field that over a region of interest has an intensity that varies by less than about 10 ppm. It will be understood that the resultant magnetic structure described herein and in the copending applications may not by themselves produce a field of this uniformity, but that they will maintain the perturbation of the uniform field within the gap between the pole pieces well within the limit of correction with standard shimming techniques.

The term "substantially" appears from time to time in the specification and claims. It should be understood in a practical sense to mean small variations in some structure or parameter term that do not make significant changes in properties associated with those structures or parameters and are included within the scope of the associated term.

The term "essentially" appears from time to time in the specification and claims. It should be understood in a practical sense to mean that it defines a structure which functionally can be characterized in a certain way but in which other aspects of the structure may be present that do not strictly conform to the sense used but also do not significantly detract from its prime or essential function. For example, a magnet may be referred to as essentially cylindrical, when in fact it may have non-cylindrical portions. But for design purposes, the magnet can still be characterized as cylindrical as the latter term signifies its main functional attributes. The same applies also with respect to the use of the term conical.

Magnetic systems of this kind are often designed using a so-called non-dimensional number identified by the symbol K, which can vary between 0 and 1. Typically, one starts the design with a chosen value for K depending upon the size, magnetic materials available and the field intensity desired, and this value of K remains unchanged. It will also be understood that permanent magnetic materials having the highest magnetic properties including remanence are preferred. Nowadays, these are the family of rare earth magnets such as Nd,B,Fe. Variations in the relative proportions of the main ingredients of such magnets, as is well known in the art, typically results in variations of the alloys' main magnetic properties.

When the application speaks of "configuring" the magnetic structure, this is to be understood in the context of this and the referenced literature to mean the design scheme of selecting the geometry, dimensions, materials, and/or magnetizations of the various members of the structure in the light of the design parameter K chosen and such additional constraints as the desired active field intensity, maintenance of field uniformity, and reduction of stray fields.

Open magnetic structures used to implement NMR imaging are often constructed of blocks of permanent magnetic material assembled to form the configuration of the sides, top, and bottom of the structure desired and defining a cavity on its interior for receiving the patient. This is typically a simpler scheme for fabricating such systems as regularly shaped blocks uniformly magnetized in a single direction are easier to fabricate by the usual powder metallurgy and grinding steps. Thus, where the specification or claims call for, for example, a conical or cylindrical-shaped magnetic structure, this should be understood to include a single member with that configuration, or several members held together by magnetic forces forming a composite member with that configuration, since, magnetically speaking, the performance is substantially the same. Moreover, though the magnetic shapes used to illustrate the invention are typically shown with smooth surfaces, in many cases the structure configuration could be implemented with several joined magnetic members which together produce a functional equivalent. For example, the round surface of a conical or cylindrical configuration can sometimes be more easily obtained with a composite structure made up of thin round slabs of permanent magnetic material which form a slightly stepped outer surface. The composite structure, overall, would still be classified as conical or cylindrical, as the case may be, and the resultant orientation of their magnetic fields can still be represented by a single arrow. For convenience, it may also be simpler to define the system using an arbitrary rectangular or spherical coordinate system, in which, as shown in the literature referenced, linear dimensions of the rectangular system coordinate system are measured along the x, y or z dimension, and the corresponding dimensions of the spherical coordinate system are measured along radii and by angles from arbitrary lines or planes. Also, for convenience of explanation, in the preferred embodiment which is analyzed in the spherical coordinate system, the direction of the uniform field is chosen parallel to the z axis which happens to be the cone axis also, and the patient's orientation is chosen such that his or her longitudinal axis is perpendicular to the z axis, so that, when the patient is within the magnetic structure for head imaging in a normal position flat on his or her back, his or her body stretches in a direction perpendicular to the z direction, and thus perpendicular to the direction of the uniform field at the plane of the body. The patient would normally lie on a non-magnetic table within the system, but for convenience the table is not shown in the drawings as it has no effect on the magnetic properties. The spherical coordinate system is indicated in the drawings. The description of the invention focuses on the magnetic structure in the vicinity of the head and shoulders of the patient. It will also be understood that, in practical situations, normal manufacturing tolerances both in dimensions as well as in magnetic properties of the magnetic blocks introduce minor field distortions and fluctuations which are commonly compensated by a known process called "tuning" or "shimming", using shims to adjust the positions of the magnetic members, and filters for field non-uniformities. Also, in the drawings, arrows are present labeled with a J or H, where J is the standard symbol for remanance, H the standard symbol for the magnitude of the uniform field, and $\mu$ the standard symbol for magnetic permeability.

The concepts underlying the development of the invention are best understood in the light of the extended development presented in the Appendices annexed to the three referenced copending applications, which applications are all fully incorporated herein by reference. They are more fully described below, but can be briefly described as involving the following recognitions.

1. A uniform magnetic field capable of implementing NMR imaging can be generated in a cavity by a conical structure defining opposed inner and outer conical sections positioned adjacent and bordering the cavity, with selected cone angles.

2. The conical structure shape provides a small cavity connected to an adjacent larger cavity, in which the small cavity can be configured to accommodate the head of a patient, and the adjacent larger cavity can be configured to accommodate the shoulders of the patient.

3. The outer conical section comprises permanent magnetic material and the inner conical section comprises high permeability magnetic material.

4. By a careful configuration of the annular surface of contact between the inner surface of the conical magnetic section and the outer surface of the high permeability magnetic material, as explained below, it is possible to integrate the different sections of a permanent magnetic section into a single permanent magnetic section which greatly simplifies the construction and fabrication of the overall magnetic structure compared with the embodiments illustrated in the copending referenced applications.

In implementing the principles described above, a number of different configurations of magnetized material and soft ferromagnetic materials are possible. A preferred configuration will be described in detail below, but it will be understood that the invention is not limited to that particular configuration and dimensions where indicated and other different combinations of magnetic materials and of other dimensions can be employed following the principles described below to achieve the benefits of the invention, as will be understood by those skilled in this art.

The following is a more rigorous mathematical explanation of the principles on which the present invention is based, which will be further elaborated on in the specification portions following, again bearing in mind the contents of the referenced copending applications.

An object of the present invention is a novel permanent magnet, designed for MRI imaging of the head, at a field level of about 0.5 Tesla. As described earlier, the magnet combines a conical structure of permanently magnetized material with ferromagnetic pole pieces.

FIG. 2.1 shows the basic conical structure 10 of magnetic material contained between two coaxial cones of half angles $\theta_1$ and $\theta_0$. The material is magnetized 16 with a uniform remanance $J_0$ parallel to the axis z (the longitudinal axis 14) of the cone. The medium surrounding the external cone is non-magnetic, and the internal cone 12 is the surface of a ferromagnetic cone of infinite magnetic permeability. Assume a system of spherical coordinates $\rho$, $\theta$, $\psi$. In the limit of infinite radial dimensions, the magnetostatic potential $\Phi$ generated by remanance $J_0$ within the magnetic material as described earlier is:

$$\Phi(\rho, \theta) = -\frac{J_0}{\mu_0}(1 - x_0^2)x_0\rho\left[1 - \frac{x}{x_1} + \frac{x}{2}\ln\frac{(1 + x_1)(1 - x)}{(1 - x_1)(1 + x)}\right] \quad (2.1)$$

where:

$$x = \cos\theta, \ x_0 = \cos\theta_0, \ x_1 = \cos\theta_1 \quad (2.2)$$

and $\mu_0$ is the magnetic permeability of a vacuum. The magnetostatic potential is the potential of a uniform field of intensity $H_0$ oriented parallel to the z axis and magnitude:

$$\mu_0 H_0 = K J_0 \quad (2.3)$$

where:

$$K = (1 - x_0^2)\left[1 - \frac{x_0}{x_1} + \frac{x_0}{2}\ln\frac{(1 + x_1)(1 - x_0)}{(1 - x_1)(1 + x_0)}\right] \quad (2.4)$$

The surface designated 8 is the outer surface of the magnetized conical section, and the surface designated 5 is the inner surface of that conical section.

The basic schematic of FIG. 2.1 can be transformed into the structure of FIG. 2.2 where the magnetized material in the region $-z_0 < z < +z_0$ is replaced by a non-magnetic material 3 (the gap) confined between two circular surfaces 4 of infinite magnetic permeability. The equipotential surfaces 5 emerging from the circular boundaries also become surfaces of infinite magnetic permeability.

Also as shown in FIG. 2.2, the equipotential surfaces 7 that contain the planes $z=\pm z1$ can be transformed into surfaces of infinite magnetic permeability. The transformation defined in FIG. 2.2 does not affect the field generated by the original conical structure. Thus, FIG. 2.2 generates the central gap 3 needed for imaging and enlarges the z dimension of the magnet necessary to accept the rest of the body.

A simplified version of the structure of FIG. 2.2 is shown in FIG. 2.3 where the exact transformation of the $\mu=\infty$ material at $z=\pm z_1$ is replaced by the same magnetized material of the cone with the uniform remanence $J_0$ parallel to the axis z. The simplified version takes advantage of the distance of the transition at $z=\pm z_1$ from the imaging region in the gap 3. The example of FIG. 2.4 of the simplified schematic of FIG. 2.3 corresponds to magnet dimensions in mm that maintain the perturbation of the uniform field within the gap between the pole pieces well within the limit of correction with standard shimming techniques. The basic dimensions of the magnet components shown in FIG. 2.4 correspond to a selection of the cone angles $\theta_1=20°$, $\theta_0=45°$. The double line 162 at the top of FIG. 2.4 represents the magnet yoke that closes the flux of the magnetic induction. Ideally, the imaging region can be assumed to be a sphere of radius $z_0$ centered at the center of the gap 3 between the pole pieces 12.

FIG. 2.5 shows the plotting of the field along the axis z and the radial coordinate r in the equatorial plane resulting from approximating the exact equipotential surface of the pole pieces given by Equation 2.1 with an increasing number N of segments. Where N=1, meaning the calculation is carried out on a straight line between C1 and C10 in FIG. 2.4, the uniformity in the gap is relatively poor. As the number of segments calculated over the length of the surface represented by the line C1–C10 increases signified by increasing values of N, the field uniformity improves. The slightly concave curved line C1–C10 that appears in FIG. 2.4 corresponds to the calculations performed with N=9 segments. The actual coordinates for that particular embodiment are listed below in the table for the dimensions indicated in FIG. 2.4. The plots in FIG. 2.5 show how critical the implementing of the exact profile is in the manufacture of the magnet.

The example of FIG. 2.4 further shows that a field of 0.45 Tesla is attained in the gap 3 between the pole pieces 12 with about 2.9 tons of rare-earth magnetic material of remanences=1.38 Tesla. Thus, this new magnetic structure provides an efficient and powerful imaging tool for clinical as well as interventional applications.

The following table represents the coordinates of 10 points along the surface represented by the line C1–C10 in FIG. 2.4. With the assumed dimensions indicated in FIG. 2.4, and the assumed angles given above, which is exemplary only, a conical magnetic section 172 is configured that will maintain the distortions of the desired uniform field in the gap at sufficiently small values that allows correction by standard shimming techniques.

It will be understood that the values given in the TABLE that determine the shape of the boundary represent just one example of a suitable configuration. As a person of ordinary skill in this art will understand, choosing other initial dimensions for the cavity and other angles and another magnetic material, as also explained in the referenced incorporated applications, will require the re-calculation of the configuration of the boundary surface represented by the line C1–C10 in the first quadrant to obtain the improved uniformity.

One example of one method for calculating the configuration of the boundary surface 5 is as follows, though it will be understood that the invention is not necessarily limited to this preferred method.

1. One possible suitable starting point is a choice of the head and shoulder cavity dimensions that will accommodate the head and shoulders of an ordinary adult. In the example given, the head cavity has a radial dimension of 300 mm (remember that only one quadrant is shown in FIG. 2.4) and a height, the vertical spacing between the pole pieces, also of 300 mm.

2. Suitable angles are chosen to accommodate the shoulders of the patient and not extend unnecessarily the overall dimensions of the structure which are the example angles given above.

3. The strongest permanent magnetic material is preferably used which determines its remanence J which with a typical value of K determines the desired uniform field intensity $H_0$ in the head cavity or gap 3.

4. Thus the coordinates of the point C10 and the value of the magnetostatic potential $\Phi$ are determined by the previous choices made.

5. The magnetostatic potential $\Phi$ is maintained constant along the whole boundary surface represented by the line C1–C10.

6. The coordinates for the remaining nine points (or for whatever number of segments is chosen) of the boundary surface are calculated from Equation 2.1 for $\Phi=C_0$ and in this way the r and z coordinates are determined for each of the remaining points C9–C1, resulting in the profile of the surface represented by the line C1–C10 that will produce a desired equipotential surface.

7. A similar process is carried out to determine the location of the boundary 2 between the inner surface of the upper permanent magnetic section 176 and the adjacent non-magnetic region 178, which can be, for example, air, since again the determining factor is the magnetostatic potential that is maintained constant to minimize field distortions in the region of interest. In this way, for the example given, the boundary is located 65 mm from the z axis.

TABLE

| | | | |
|---|---|---|---|
| $C1_r$ | 205.80 | C1z | 458.60 |
| $C2_r$ | 197.78 | C2z | 427.15 |
| $C3_r$ | 190.38 | C3z | 395.08 |
| $C4_r$ | 182.37 | C4z | 363.63 |
| $C5_r$ | 175.58 | C5z | 331.56 |
| $C6_r$ | 168.18 | C6z | 300.11 |
| $C7_r$ | 162.63 | C7z | 267.42 |
| $C8_r$ | 157.08 | C8z | 237.82 |
| $C9_r$ | 152.76 | C9z | 202.67 |
| $C10_r$ | 150.00 | C10z | 150.00 |

FIG. 2.7 is a perspective view of the structure of FIG. 2.4 expanded into the four quadrants, and FIG. 2.6 is an exploded view. Numeral 124 references the high permeability core. Numeral 170 references the permanent magnet which is composed of three sections integral with one another and with no gaps or other material present between the high permeability core and the magnetic section. The conical section is designated 172, integral with the laterally-extended cylindrical section 174, in turn integral with the outer cylindrical section 176 surrounding a non-magnetic section 178 aligned with the longitudinal axis 14. The yoke, as in the earlier applications, is a C-shaped soft magnetic structure comprising arms 162, 164 connected by a bight 160. The FIG. 2.6 view is depicted as if the whole structure was lifted out of the yoke bight 160 and then exploded. The FIG. 2.7 embodiment shows one quadrant corresponding to FIG. 2.4 cut out and removed to show the inner construction.

As will be observed, with the structure lying on its base represented by the yoke bight 60, due to the circular-symmetry, the patient can be introduced into the cavity from both sides as well as from the top, as the shoulder cavity 134 surrounds the smaller head cavity 132 bounded by the pole piece surfaces 4. The patient is positioned for head NMR imaging with its head inside the cavity 132 and its shoulders extending into the cavity 134. The magnet configuration described will generate a uniform imaging field in a region of interest surrounding the patient's head, the magnetic field having an intensity $H_0$ along the z axis in FIG. 2.6.

As with the embodiments of the related applications, it will be appreciated that the embodiment of FIG. 2.4 represent only one quadrant of the structure. The full structure is obtained as illustrated in FIGS. 2.6 and 2.7 by rotating that quadrant about the vertical and horizontal axes originating at the origin 0, and thus expanded to include both upper right (shown in FIG. 2.4) and left quadrants, to form a circular-symmetrical magnetic structure 142, spaced opposite to an identical structure 144 corresponding to the lower right and left quadrants.

Those skilled in the art will appreciate that the invention is not necessarily limited to structures with the dimensions indicated in the drawings, which are only to illustrate the size of a particular embodiment. The preferred geometry illustrated can be replaced by other geometries following the principles described herein. In particular, the half-angle $\theta_0$ and half-angle $\theta_1$ are not limited to the two values given in the preferred embodiment. Those values are preferred because they represent a good practical compromise among factors such as the overall size of the unit, the volume of magnetic material required, the magnetic field intensity, and the patient's accommodation. For example, increasing $\theta_0$ (for example, $\theta_1=20°$, $\theta_0=50°$, for K=0.55) increases the structure's size, requires more magnetic material, and may undesirably reduce the patient's cavity, though it will also allow a higher field intensity with the increased magnetic material. Keeping $\theta_0$ at 50°, but increasing $\theta_1$ to 30°, for example, likewise may also require more magnetic material but with a smaller K will result in a smaller field intensity. Reducing both angles will likely produce too narrow a practical structure with inadequate patient space. These other geometries are also considered within the scope of the invention. It will also be understood that the magnet may be rotated about the y axis within the magnetic structure in order to facilitate access to different sides of the brain.

While the invention has been described in connection with preferred embodiments, it will be understood that modifications thereof within the principles outlined above will be evident to those skilled in the art and thus the invention is not limited to the preferred embodiments but is intended to encompass such modifications.

What is claimed is:

1. A magnetic structure for generating a uniform magnetic field capable of implementing NMR imaging of the head of a patient within a region of interest, comprising:
   a) first and second magnetic structures defining a first cavity having the region of interest and configured to accommodate the head of a patient and defining adjacent the first cavity a second cavity, larger than the first cavity, configured to accommodate the shoulders of the patient when the latter's head is positioned in the first cavity, the first and second magnetic structures being positioned on opposite sides of the first and second cavities and defining a common longitudinal axis through the centers of the first and second magnetic structures and providing access if desired from the outside for surgical intervention to the head of the patient when positioned within the first cavity,
   b) each of the first and second magnetic structures comprising a magnetic structure including:
      i) an annular section of permanent magnetic material and having a conical portion having a narrower end and a wider end and substantially inner and outer conical surfaces and a conical axis coincident with the common longitudinal axis, the narrower end being positioned closer to the region of interest than the wider end, the permanent magnetic section having a first value and a first orientation of remanence,
      ii) a pole piece member of ferromagnetic material and positioned within the conical section adjacent and bordering its inner conical surface and having an axis also coincident with the common longitudinal axis, the annular surface of contact between the inner conical surface of the permanent magnetic section and the bordering pole piece member being slightly curved,
   c) the permanent magnetic sections and the pole piece members of the first and second magnetic structures cooperating to produce within the first cavity a substantially uniform magnetic field capable of supporting NMR imaging,
   d) the shape of the annular curved surface of contact being configured so as to form at that surface an equipotential surface, whereby distortion of the substantially uniform magnetic field is minimized.

2. A magnetic structure as claimed in claim 1, wherein each of the permanent magnetic sections of the first and second magnetic structures further comprises a first cylindrical magnetic section extending radially in a direction away from the common longitudinal axis and integral with the conical section.

3. A magnetic structure as claimed in claim 2, wherein each of the pole piece members have an inner surface bounding the first cavity and an outer surface remote from the first cavity, each of the permanent magnetic sections of the first and second magnetic structures further comprising a second cylindrical magnetic section integral with the first cylindrical section and extending over the outer surface of the adjacent pole piece member.

4. A magnetic structure as claimed in claim 3, wherein the conical portion and the first and second cylindrical magnetic sections of each of the first and second magnetic structures form a one-piece integral permanent magnetic body.

5. A magnetic structure as claimed in claim 4, wherein the one-piece integral permanent magnetic body of each of the first and second magnetic structures is magnetized with an orientation parallel to the common longitudinal axis.

6. A magnetic structure as claimed in claim 3, wherein each of the second cylindrical magnetic sections bound a non-magnetic region aligned with the common longitudinal axis.

7. A magnetic structure as claimed in claim 6, wherein the non-magnetic regions of each the second cylindrical magnetic sections are positioned at predetermined locations selected such as to establish magnetostatic potentials that support the substantially uniform magnetic field.

8. A magnetic structure as claimed in claim 1, wherein the annular curved surface of contact is concave and faces away from the common longitudinal axis.

9. A magnetic structure as claimed in claim 1, wherein the first and second magnetic structures are configured such that the second cavity surrounds the first cavity and both the first and second magnetic structures are circular symmetric about the common longitudinal axis.

10. A magnetic structure as claimed in claim 1, further comprising a yoke magnetically connected to the first and second magnetic structures.

11. A magnetic structure as claimed in claim 1, wherein the ferromagnetic pole piece member of each of the first and second magnetic structures has a high permeability and a generally conical shape.

12. A method of designing a magnetic structure for generating a uniform magnetic field capable of implementing NMR imaging of the head of a patient within a region of interest, the magnetic structure comprising:

a) first and second magnetic structures defining a first cavity having the region of interest and configured to accommodate the head of a patient and defining adjacent the first cavity a second cavity, larger than the first cavity, configured to accommodate the shoulders of the patient when the latter's head is positioned in the first cavity, the first and second magnetic structures being positioned on opposite sides of the first and second cavities and defining a common longitudinal axis through the centers of the first and second magnetic structures and providing access if desired from the outside for surgical intervention to the head of the patient when positioned within the first cavity, b) each of the first and second magnetic structures comprising a magnetic structure including:
  i) an annular section of permanent magnetic material and having a conical portion having a narrower end and a wider end and substantially inner and outer conical surfaces and a conical axis coincident with the common longitudinal axis, the narrower end being positioned closer to the region of interest than the wider end, the permanent magnetic section having a first value and a first orientation of remanence,
  ii) a pole piece member of ferromagnetic material and positioned within the conical section adjacent and bordering its inner conical surface and having an axis also coincident with the common longitudinal axis, the annular surface of contact between the inner conical surface of the permanent magnetic section and the bordering pole piece member being slightly curved, c) the permanent magnetic sections and the pole piece members of the first and second magnetic structures cooperating to produce within the first cavity a substantially uniform magnetic field capable of supporting NMR imaging, comprising the steps:

A) chosing the head and shoulder cavity dimensions that will accommodate the head and shoulders of an ordinary patient;

B) chosing suitable angles to accommodate the shoulders of the patient and not extend unnecessarily the overall dimensions of the structure;

C) chosing the permanent magnetic material to use which determines its remanence J which with a typical value of K determines the desired uniform field intensity $H_0$ in the first cavity;

D) the coordinates of a point C10 on the annular surface of contact adjacent the first cavity and the magnetostatic potential being determined by the choices made in steps A–C;

E) maintaining constant the magnetostatic potential $\Phi$ determined in step D, determining the coordinates for at least several more points along the annular surface of contact by calculation from Equation 2.1 for $\Phi=C_0$ to determine a profile for the annular surface of contact;

F) constructing the annular section of permanent magnetic material using the profile determined in step E and assembling to the remainder of the magnetic structure.

13. A method as set forth in claim 12, further comprising the step:

H) before step F, repeating step E to determine the shape of the upper part of the annular section of permanent magnetic material to be assembled to the remainder of the magnetic structure.

14. A method as set forth in claim 12, further comprising the steps:

H) providing an opening in the upper part of the annular section of permanent magnetic material adjacent the longitudinal axis, the opening being positioned to minimize field distortions in the region of interest;

I) shaping the outer surface of the pole piece member of ferromagnetic material to conform to the profile determined in step E.

* * * * *